United States Patent
Lin et al.

(10) Patent No.: US 9,978,789 B2
(45) Date of Patent: May 22, 2018

(54) IMAGE-SENSING DEVICE

(71) Applicant: VisEra Technologies Company Limited, Hsin-Chu (TW)

(72) Inventors: Kuo-Feng Lin, Kaohsiung (TW); Yu-Kun Hsiao, Hsin-Chu (TW); Chin-Chuan Hsieh, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days. days.

(21) Appl. No.: 15/174,139

(22) Filed: Jun. 6, 2016

(65) Prior Publication Data
US 2017/0352693 A1    Dec. 7, 2017

(51) Int. Cl.
*H01L 27/146* (2006.01)

(52) U.S. Cl.
CPC .... *H01L 27/1462* (2013.01); *H01L 27/14607* (2013.01); *H01L 27/14621* (2013.01)

(58) Field of Classification Search
CPC .......... H01L 27/1462; H01L 27/14607; H01L 27/14621; H01L 27/14627; H01L 27/14685; H01L 27/14689; H01L 27/14623; G02B 5/201; G02F 1/133536; G02F 1/133526
USPC .... 250/208.1, 338.4; 257/E21.001, E31.002; 438/70; 349/96, 106, 119
See application file for complete search history.

(56) References Cited

U.S. PATENT DOCUMENTS

| | | |
|---|---|---|
| 2007/0284510 A1 | 12/2007 | Li et al. |
| 2008/0036024 A1 | 2/2008 | Hwang et al. |
| 2008/0185500 A1* | 8/2008 | Toshikiyo ......... H01L 27/14627 250/208.1 |
| 2009/0179289 A1* | 7/2009 | Park .................. H01L 27/14627 257/432 |

(Continued)

FOREIGN PATENT DOCUMENTS

| | | |
|---|---|---|
| JP | 2000-147232 A | 5/2000 |
| JP | 2004-20957 A | 1/2004 |

(Continued)

OTHER PUBLICATIONS

The Office Action of corresponding JP application No. 2016-185256 dated Jun. 19, 2017 with its English translation (17 pages).

(Continued)

*Primary Examiner* — Mouloucoulaye Inoussa
(74) *Attorney, Agent, or Firm* — Muncy, Geissler, Olds & Lowe, P.C.

(57) ABSTRACT

An image-sensing device includes a semiconductor substrate, a passive layer, and a light-collecting element. The semiconductor substrate includes a photo-sensing element, and the passive layer is disposed over the semiconductor substrate. The light-collecting element is disposed over the passive layer, and includes first, second and third loops. The first loop has a first width. The second loop surrounds the first loop and has a second width that is less than the first width. The third loop surrounds the first and second loops, and has a third width that is less than the second width. The light-collecting element aligns with the photo-sensing element, and the first, second, and third loops include different refractive indices.

19 Claims, 10 Drawing Sheets

(56) References Cited

U.S. PATENT DOCUMENTS

2011/0049661 A1* 3/2011 Maehara ............... H01L 27/307
                                                                                257/432
2014/0264686 A1* 9/2014 Tu ..................... H01L 27/14627
                                                                                257/432

FOREIGN PATENT DOCUMENTS

| JP | 2007-109801 A | 4/2007 |
| JP | 2008-66702 A | 3/2008 |
| JP | 2009-157390 A | 7/2009 |
| JP | 2010-27875 A | 2/2010 |
| JP | 2014-78015 A | 5/2014 |
| WO | WO 2005/059607 A1 | 6/2005 |

OTHER PUBLICATIONS

An Office Action from corresponding TW Application No. 105128877 dated Nov. 14, 2017; 4 pgs.

* cited by examiner

IMAGE-SENSING DEVICE

BACKGROUND OF THE INVENTION

Field of the Invention

The present invention relates to image-sensing devices, and more particularly to an image-sensing device with improved quantum efficiency.

Description of the Related Art

Image-sensing devices are necessary components in many optoelectronic devices, including digital cameras, cellular phones, and toys. Conventional sensing devices include both charge coupled device (CCD) image sensors and complementary metal oxide semiconductor (CMOS) image sensors.

An image-sensing device typically includes a plane array of pixel cells, wherein each pixel cell comprises a photogate, a photoconductor or a photodiode having a doped region for accumulating a photo-generated charge. A periodic pattern of dyes of different colors such as red (R), green (G), or blue (B) is superimposed over the plane array of pixel cells. This pattern is known as a color filter array (CFA). A plurality of microlenses of a square or a circular shape can be optionally superimposed over the color filter array (CFA) to focus light onto one initial charge accumulation region of each of the pixel cells. Using the microlenses may significantly improve the photosensitivity of the image sensor.

However, since incident light passing through the microlens cannot be focused to a deep region in the photo-sensing element of the pixels, the quantum efficiency of the pixel cells in image-sensing devices is somehow limited and cannot be increased by use of a microlens. Accordingly, the quantum efficiency of the pixel cells is limited, as well as the sensitivity of the pixel cells.

BRIEF SUMMARY OF THE INVENTION

Accordingly, image-sensing devices are provided to improve quantum efficiency and sensitivity of an image-sensing device.

An exemplary image-sensing device comprises a semiconductor substrate, a passive layer, and a light-collecting element. The semiconductor substrate comprises a photo-sensing element, and the passive layer is disposed over the semiconductor substrate. The light-collecting element is disposed over the passive layer, and comprises first, second and third loops. The first loop has a first width. The second loop surrounds the first loop and has a second width that is less than the first width. The third loop surrounds the first and second loops, and has a third width that is less than the second width. The light-collecting element aligns with the photo-sensing element, and the first, second, and third loops comprise different refractive indices.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
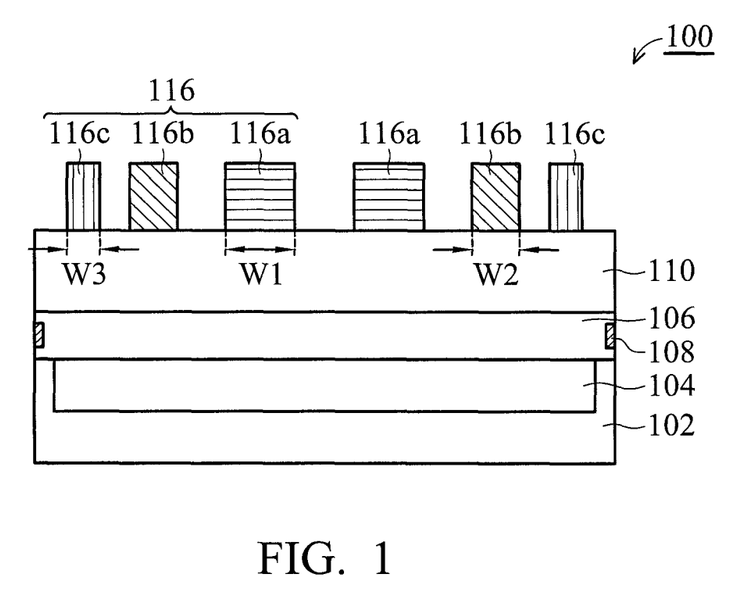
FIG. 1 is a schematic cross section showing an image-sensing device according to an embodiment of the invention.

FIG. 1 is schematic cross section showing an exemplary image-sensing device 100. The image-sensing device 100 comprises a semiconductor substrate 102 with a photo-sensing element 104 formed therein, a passive layer 106 with a plurality of light shielding metals 108 formed therein over the semiconductor substrate 102, a color pattern 110 over the passive layer 106, and a light-collecting element 116 over the color pattern 110.

As shown in FIG. 1, the semiconductor substrate 102 can be, for example, a silicon substrate, and the photo-sensing element 104 can be, for example, a photodiode formed in the semiconductor substrate 102. The passive layer 106 can be a single layer or a composite layer comprising dielectric materials (not shown) and conductive elements (not shown) for forming, for example, interconnect structures (not shown) between the photo-sensing element 104 and external circuits (not shown) but not comprising photo-sensing elements therein. The light shielding metals 108 in the passive layer 106 are respectively formed over the semiconductor substrate 102 at a place not covering the photo-sensing element 104 therein, thereby defining a light-shielding area for shielding the area of the pixel except for the area of the photo-sensing element 104 and defining an opening area exposing the area of the photo-sensing element 104.

Moreover, as shown in FIG. 1, the color pattern 110 over the passivation layer 106 is also formed over the photo-sensing element 104 to align therewith. The light-collecting element 116 over the color pattern 110 is formed over the photo-sensing element 104 to focus and transfer incident light into the photo-sensing element 104. In one embodiment, the color pattern 110 may comprise photosensitive type color resists of the same color or different colors selected from the group consisting of red (R), green (G), blue (B), and white (W), and may be formed by, for example, spin coating and a photolithography process.

As shown in FIG. 1, the light-collecting element 116 may comprise a plurality of loops disposed over the color pattern 110, having different refractive indices and widths and the same height. In one embodiment, the light-collecting element 116 may comprise three loops separately formed over the color pattern 110 as shown in FIG. 1, and the three loops shown in FIG. 1 comprise different refractive indices (n) and widths, and the same height. The number of loops of the light-collecting element 116 shown in FIG. 1 is for the purpose of illustration, but is not to limit the scope of the invention.

As shown in FIG. 1, in one embodiment, the width of the loops disposed over the color pattern 110 may be reduced from a center portion of the image-sensing device 100 to an edge portion of the image-sensing device 100. Therefore, the light-collecting element 116 may comprise a first loop 116a having a first width W1, a second loop 116b surrounding the first loop 116a, having a second width W2 that is less than the first width W1, and a third loop 116c surrounding the first loop 116a and second loop 116b, having a third width W3 that is less than the second width W2. The first, second and third loops 116a, 116b, 116c may have the same height of about 100-500 nm.

As shown in FIG. 1, in one embodiment, the refractive index (n) of the loops disposed over the color pattern 110 may be increased from a center portion of the image-sensing device 100 to an edge portion of the image-sensing device 100. In one embodiment, the first loop 116a may have a refractive index of about 1.4-1.7, the second loop 116b may have a refractive index of about 1.7-2.0, and the third loop 116c may have a refractive index of about 2.0-2.5. In one embodiment, the first loop 116a may comprise materials such as silicon oxide ($SiO_2$), barium fluoride ($BaF_2$), or calcium fluoride ($CaF_2$), and the second loop 116b may comprise materials such as magnesium oxide (MgO), or beryllia (BeO), and the third loop 116c may comprise materials such as hafnium oxide ($HfO_2$), tantalum oxide ($Ta_2O_5$), or titanium oxide ($TiO_2$).

In one embodiment, the first loop 116a, the second loop 116b and the third loop 116c of the light-collecting element 116 shown in FIG. 1 are concentric loops separately formed over the color pattern 110. The first loop 116a, the second loop 116b and the third loop 116c of the light-collecting element 116 form a Fresnel zone plate which is capable of focusing and transferring incident light into the photo-sensing element 104, so that the first width W1 of the first loop 116a (see FIG. 1), the second width W2 of the second loop 116b (see FIG. 1), the third width W3 of the third loop 116c (see FIG. 1) and pitches between the first, second, and third loops 116a, 116b, 116c can be properly designed to form the light-collecting element 116 as the Fresnel zone plate.

Figure 2:
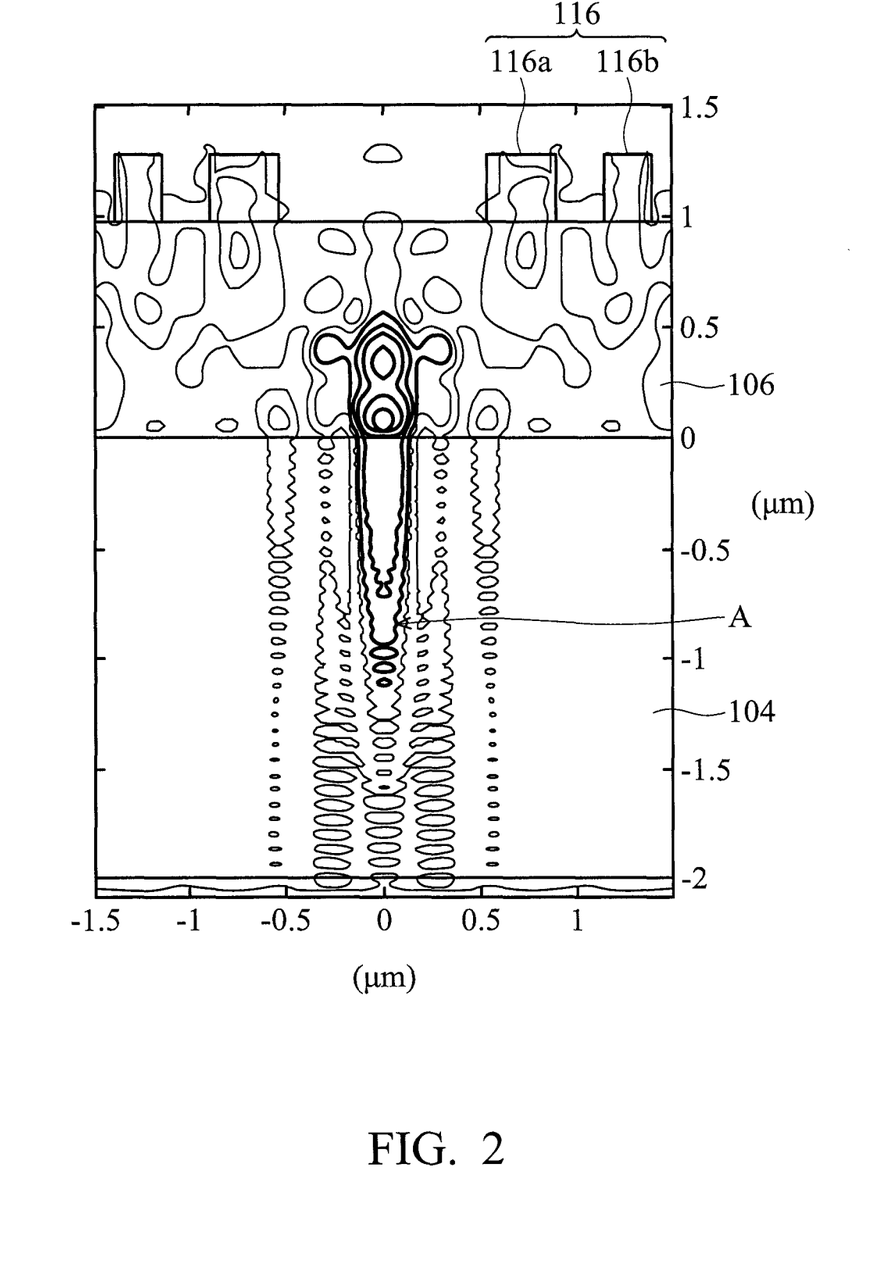
FIG. 2 shows a simulated electrical field image of the image-sensing device in FIG. 1.

FIG. 2 shows a simulated electrical field image of the image-sensing device 100 in FIG. 1. The simulated electrical field image shown in FIG. 2 is formed by examining the image-sensing device 100 in FIG. 1 by the finite-difference time-domain (FDTD) simulation method. As shown in FIG. 2, some components of the image-sensing device 100 tested by the finite-difference time-domain simulation method are omitted, so that the image-sensing device 100 only uses some components such as the photo-sensing element 104, the passive layer 106, and the first and second loops 116a and 116b of the light-collecting element 116 for the ease of simulation. As shown in the simulated electrical field image in FIG. 2, due to the formation of the light-collecting element 116 in the image-sensing device 100, incident light A with strong electrical field that passes through the light-collecting element 116 is focused into a deep portion of the photo-sensing element 104 (e.g. a depth of about 0.8 μm to a top surface of the photo-sensing element 104), and hence more incident light can be focused and arrive at a deep portion of the photo-sensing element 104. In addition, a spot size of incident light A with strong electrical field that passes through the light-collecting element 116 and arrives at the interface between the photo-sensing element 104 and the passive layer 106 has a spot size of about 0.25 μm. Therefore, the quantum efficiency of the photo-sensing element 104 can be improved, and the sensitivity of the image-sensing device 100 can also be improved. In addition, since the first and second loops 116a, 116b may have a less height of about 300 nm than a conventional microlens (not shown) having a height of several microlens, so that the image-sensing device 100 with the light-collecting element 116 shown in FIGS. 1-2 can be also provided with a reduced vertical size compared with the vertical size that can be formed using a conventional microlens, and a more compact image-sensing device can be formed.

Figure 3:
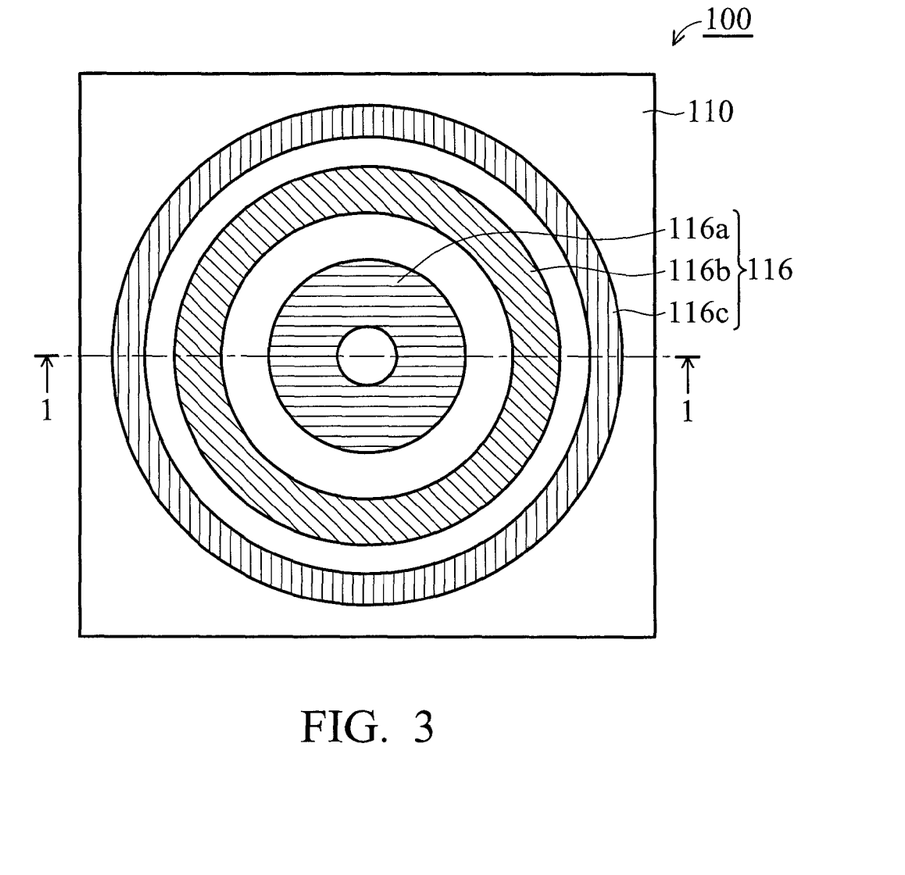
FIG. 3 is a schematic top view showing the image-sensing device in FIG. 1.

FIG. 3 is a schematic top view showing the image-sensing device 100 in FIG. 1, and the schematic cross section of the image-sensing device 100 in FIG. 1 is taken along line 1-1 in FIG. 3. For simplicity, only the photo-sensing element 104, the color pattern 110, and the first loop 116a, the second loop 116b, and the third loop 116c of the light-collecting element 116 of the image-sensing device 100 are shown in FIG. 3 for discussion.

As shown in FIG. 3, the first loop 116a, the second loop 116b, and the third loop 116c of the light-collecting element 116 are provided as concentric loops separately formed over the color pattern 110. In addition, the first loop 116a, the second loop 116b, and the third loop 116c of the light-collecting element 116 may be circular loops from a top view, but are not limited thereto. Configurations of the first loop 116a, the second loop 116b, and the third loop 116c of the light-collecting element 116, however, are not limited by those shown in FIGS. 1 and 3. In other embodiments, the first loop 116a, the second loop 116b, and the third loop 116c of the light-collecting element 116 may have other configurations, such as a polygonal shape, in other exemplary image-sensing devices.

Figure 4:
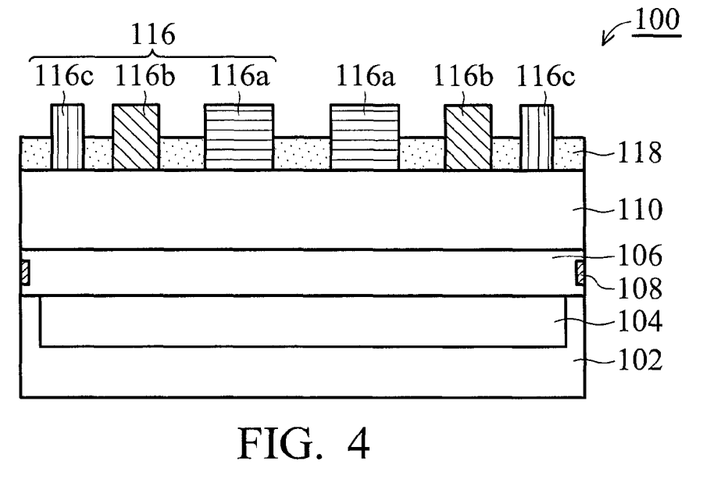
FIG. 4 is a schematic cross section showing an image-sensing device according to another embodiment of the invention.

FIG. 4 is a schematic cross section showing another exemplary image-sensing device 100. Components in the image-sensing device 100 shown in FIG. 4 are similar to those shown in FIG. 1, except that a buffer layer 118 is additionally disposed over the color pattern 110 between the first loop 116a, the second loop 116b, and the third loop 116c of the light-collecting element 116.

As shown in FIG. 4, the buffer layer 118 may have a refractive index of about 1.2-1.7. In one embodiment, the buffer layer 118 may comprise materials such as magnesium fluoride ($MgF_2$), sodium fluoride (NaF), or strontium fluoride ($SrF_2$). The top surface of the buffer layer 118 is below top surface of the first loop 116a, the second loop 116b, and the third loop 116c of the light-collecting element 116. However, in other embodiments, the top surface of the buffer layer 118 can be level with or above (both not shown) the top surfaces of the first loop 116a, the second loop 116b, and the third loop 116c of the light-collecting element 116.

Accordingly, due to the formation of the buffer layer 118 in the image-sensing device 100, reflection and scattering caused by incident light (not shown) that passes through the light-collecting element 116 and arrives at an interface between the light-collecting element 116 and the underlying color pattern 110 can be reduced or even eliminated, meaning that incident light can be focused into a deeper portion of the photo-sensing element 104 compared with the portion that can be focused by a conventional microlens, and hence more light can be focused and arrive into the photo-sensing element 104. Therefore, the quantum efficiency of the photo-sensing element 104 can be improved, and the sensitivity of the image-sensing device 100 can also be improved. In addition, the image-sensing device 100 with the light-collecting element 116 shown in FIG. 4 can also be provided with a reduced vertical size compared with the vertical size that can be formed using a conventional microlens, so a more compact image-sensing device can be formed.

Figure 5:
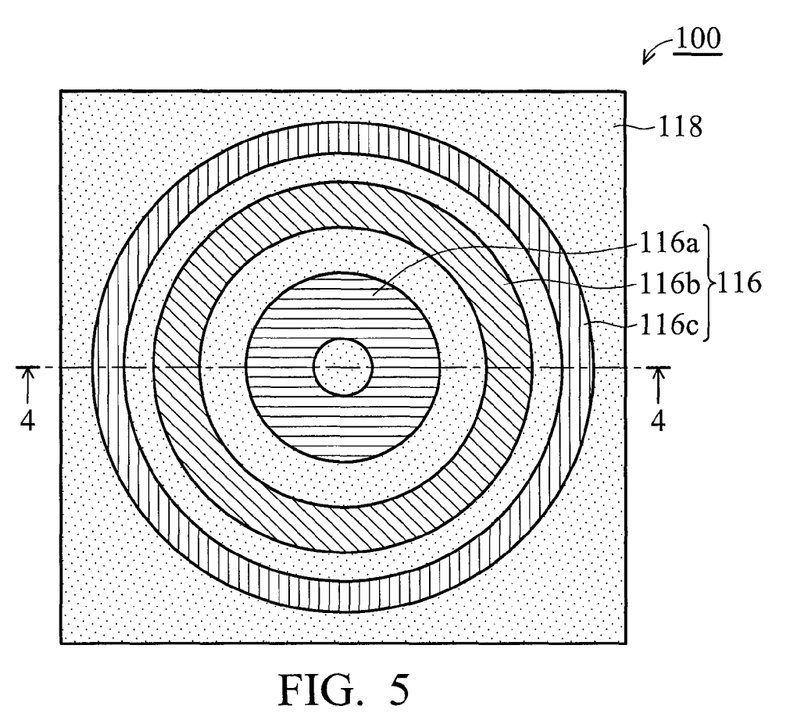
FIG. 5 is a schematic top view showing the image-sensing device in FIG. 4.

In addition, FIG. 5 is a schematic top view showing the image-sensing device 100 in FIG. 4, and the schematic cross section of the image-sensing device 100 in FIG. 4 is taken along line 4-4 in FIG. 5. For the purpose of simplicity, only the photo-sensing elements 104 of the image-sensing device 100 and the first loop 116a, the second loop 116b, and the third loop 116c of the light-collecting element 116 are shown in FIG. 5 for discussion.

As shown in FIG. 5, the first loop 116a, the second loop 116b, and the third loop 116c of the light-collecting element 116 are provided as concentric loops separately formed over the color pattern 110. In addition, the first loop 116a, the second loop 116b, and the third loop 116c of the light-collecting element 116 may be circular loops from a top view, but are not limited thereto. Configurations of the first loop 116a, the second loop 116b, and the third loop 116c of the light-collecting element 116, however, are not limited by those shown in FIGS. 4-5. In other embodiments, the first loop 116a, the second loop 116b, and the third loop 116c of the light-collecting element 116 may have other configurations, such as a polygonal shape, in other exemplary image-sensing devices.

Figure 6:
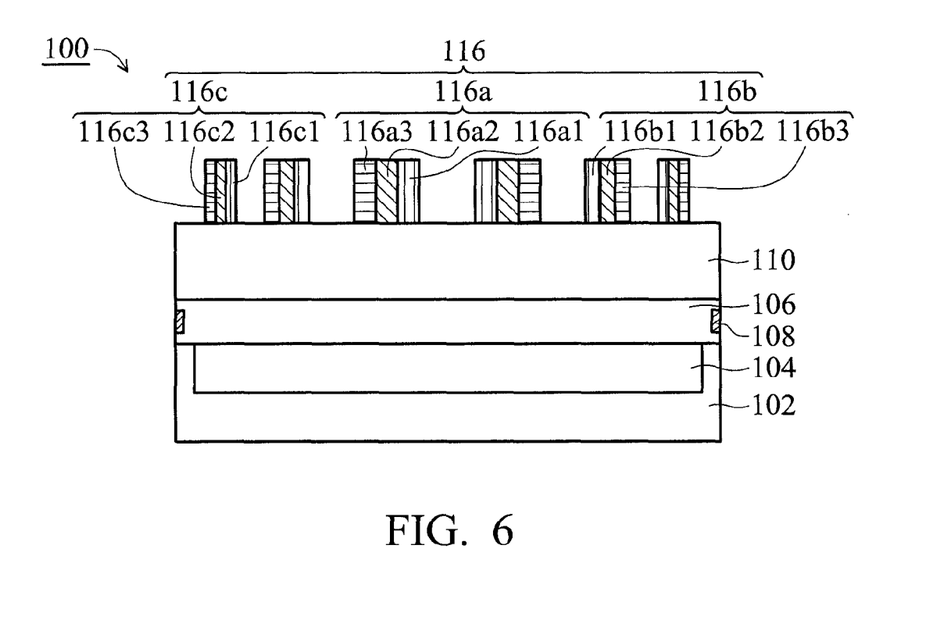
FIG. 6 is a schematic cross section showing an image-sensing device according to yet another embodiment of the invention.

FIG. 6 is a schematic cross section showing another exemplary image-sensing device 100. Components in the image-sensing device 100 shown in FIG. 6 are similar to those shown in FIG. 1, except that each of the first loop 116a, the second loop 116b, and the third loop 116c of the light-collecting element 116 now comprises a plurality of sub-layers of different refractive indices decreasing from an inner sub-layer to an outer sub-layer.

As shown in FIG. 6, the first loop 116a may have three sub-layers 116a1-116a3 of different refractive indices decreasing from an inner sub-layer (e.g. the sub-layer 116a1) to an outer sub-layer (e.g. the sub-layer 116a3). Similarly, the second loop 116b may have three sub-layers 116b1-116b3 of different refractive indices decreasing from an inner sub-layer (e.g. the sub-layer 116b1) to an outer sub-layer (e.g. the sub-layer 116b3), and the third loop 116c may have three sub-layers 116c1-116c3 of different refractive indices decreasing from an inner sub-layer (e.g. the sub-layer 116c1) to an outer sub-layer (e.g. the sub-layer 116c1).

As shown in FIG. 6, the sub-layers 116a1-116a3 of the first loop 116a may have the same width and the same height, the sub-layers 116b1-116b3 of the second loop 116b may have the same width and the same height, and the sub-layers 116c1-116c3 of the third loop 116c may have the same width and the same height. The widths of the first loop 116a, the second loop 116b, and the third loop 116c, and pitches between the first, second, and third loops 116a, 116b, 116c can be properly designed to form the light-collecting element 116 as the Fresnel zone plate.

In an embodiment, the inner sub-layer (e.g. the sub-layers 116a1, 116b1, and 116c1) of the sub-layers of the first, second, and third loops 116a, 116b, and 116c may have the same refractive index of about 2.0-2.5, the middle sub-layer (e.g. the sub-layers 116a2, 116b2, and 116c2) of the sub-layers of the first, second, and third loops 116a, 116b, and 116c may have the same refractive index of about 1.7-2.0, and the outer sub-layer (e.g. the sub-layers 116a3, 116b3, and 116c3) of the sub-layers of the first, second, and third loops 116a, 116b, and 116c may have the same refractive index of about 1.4-1.7.

In one embodiment, the inner sub-layer (e.g. the sub-layers 116a1, 116b1, and 116c1) of the inner sub-layer of the first, second, and third loops 116a, 116b, and 116c may comprise materials such as hafnium oxide ($HfO_2$), tantalum oxide ($Ta_2O_5$), or titanium oxide ($TiO_2$), and the middle sub-layer (e.g. the sub-layers 116b1, 116b1, and 116b1) of the sub-layers of the first, second, and third loops 116a, 116b, and 116c may comprise materials such as magnesium oxide (MgO) or beryllia (BeO), and the outer sub-layer (e.g. the sub-layers 116c1, 116c1, and 116c1) of the sub-layers of the first, second, and third loops 116a, 116b, and 116c may comprise materials such as silicon oxide ($SiO_2$), barium fluoride ($BaF_2$), or calcium fluoride ($CaF_2$).

Figure 7:
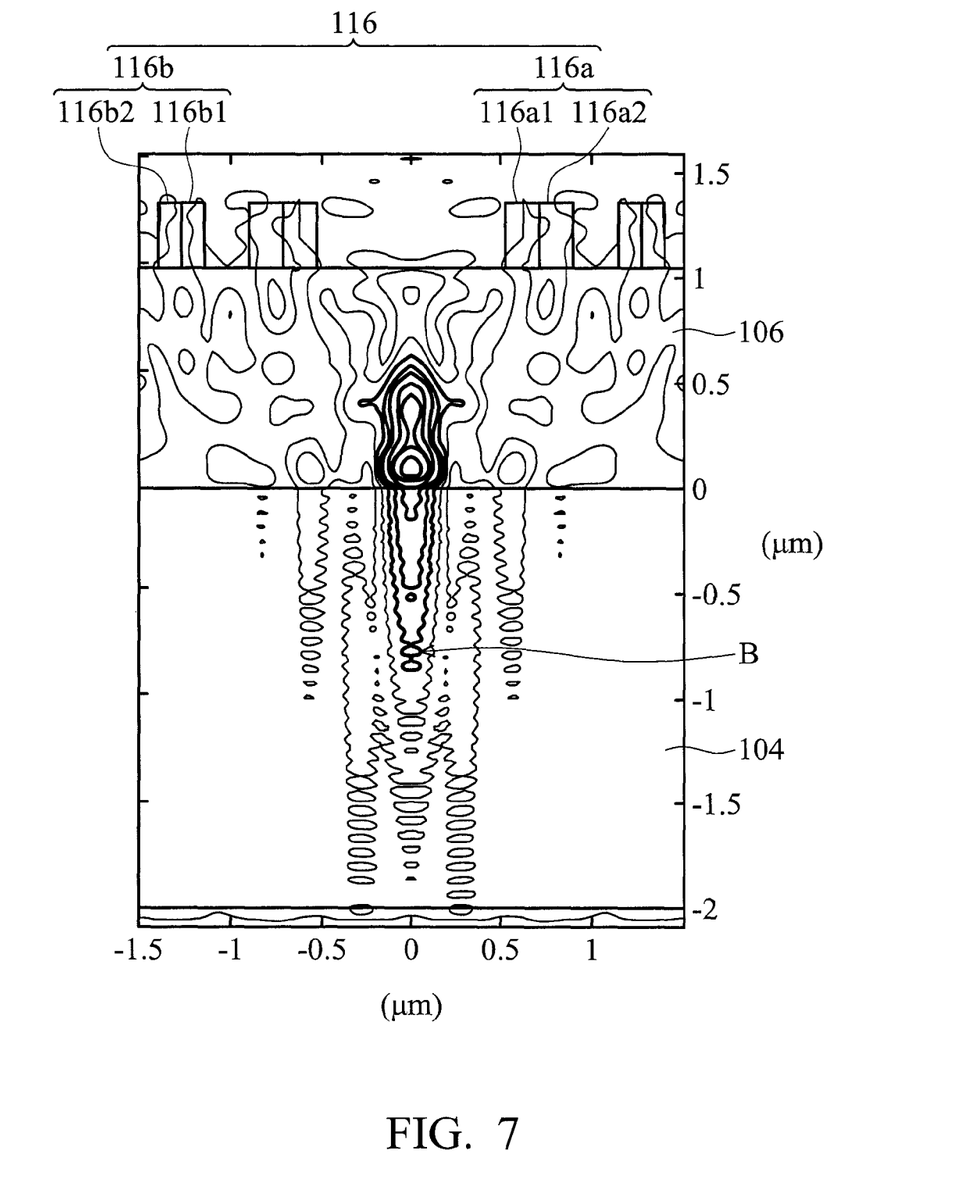
FIG. 7 shows a simulated electrical field image of the image-sensing device shown in FIG. 6.

FIG. 7 shows a simulated electrical field image of the image-sensing device 100 in FIG. 6. The simulated electrical field image shown in FIG. 7 is formed by examining the image-sensing device 100 in FIG. 6 by the finite-difference time-domain (FDTD) simulation method. As shown in FIG. 7, some components of the image-sensing device 100 tested by the finite-difference time-domain simulation method are omitted, so that the image-sensing device 100 only uses some components such as the photo-sensing element 104, the passive layer 106, the inner sub-layer 116a1 and the middle sub-layer 116a2 of the first loop 116a of and the inner sub-layers 116a2, and the inner sub-layer 116b2 and the second loop 116b of the light-collecting element 116 for the ease of simulation. As shown in the simulated electrical field image in FIG. 7, due to the formation of the light-collecting element 116 in the image-sensing device 100, incident light B with strong electrical field that passes through the light-collecting element 116 is focused into a deep portion of the photo-sensing element 104 (e.g. a depth of about 1 μm to a top surface of the photo-sensing element 104 as), and hence more incident light can be focused and can arrive at a deep portion of the photo-sensing element 104. In addition, a spot size of incident light B with strong electrical field that passes through the light-collecting element 116 and arrives at the interface between the photo-sensing element 104 and the passive layer 106 has a spot size of about 0.25 μm. Therefore, the quantum efficiency of the photo-sensing element 104 can be improved and the sensitivity of the image-sensing device 100 can also be improved. In addition, since the first and second loops 116a, 116b may have a less height of about 300 nm than a conventional microlens (not shown) having a height of several microlens, so that the image-sensing device 100 with the light-collecting element 116 shown in FIGS. 6-7 can be also provided with a reduced vertical size compared with the vertical size that can be formed using a conventional microlens, and a more compact image-sensing device can be formed.

Figure 8:
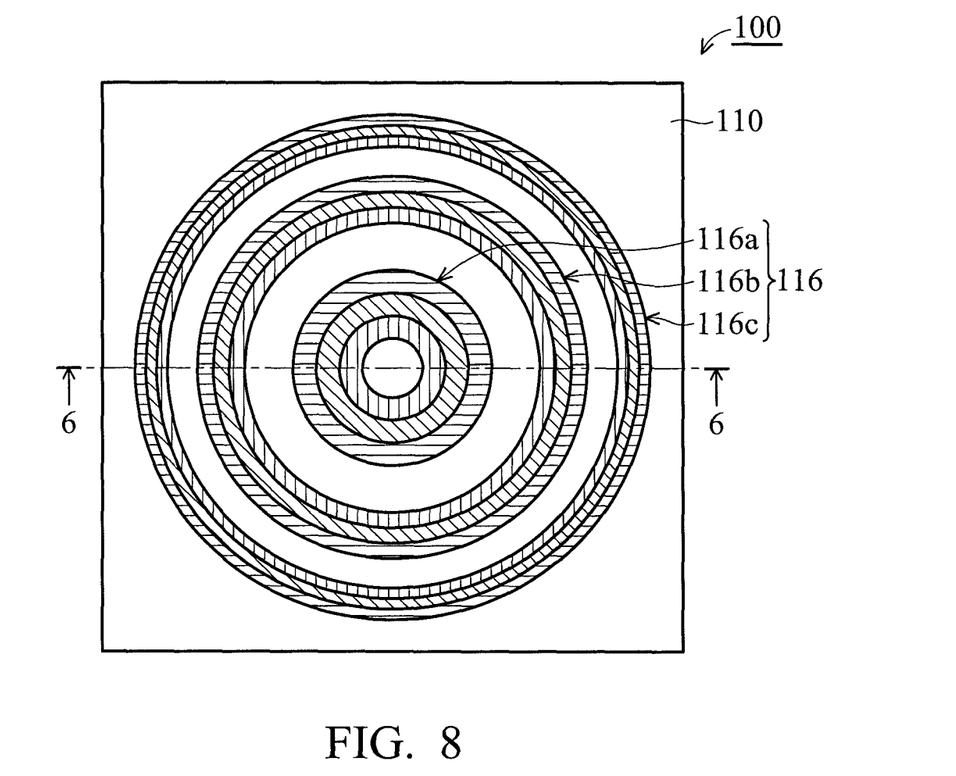
FIG. 8 is a schematic top view showing the image-sensing device in FIG. 6.

FIG. 8 is a schematic top view showing the image-sensing device 100 in FIG. 6, and the schematic cross section of the image-sensing device 100 in FIG. 6 is taken along line 6-6 in FIG. 8. For simplicity, only the color pattern 110 of the image-sensing device 100 and the light-collecting element 116 of the image-sensing device 100 are shown in FIG. 8 for discussion.

As shown in FIG. 8, the sub-layers 116a1-116a3 of the first loop 116a, the sub-layers 116b1-116b3 of the second loop 116b, and the sub-layers 116c1-116c3 of the third loop 116c of the light-collecting element 116 are provided as concentric loops separately formed over the color pattern 110. In addition, the sub-layers 116a1-116a3 of the first loop 116a, the sub-layers 116b1-116b3 of the second loop 116b, and the sub-layers 116c1-116c3 of the third loop 116c of the light-collecting element 116 may be circular loops from a top view, but are not limited thereto. In other embodiments, the sub-layers 116a1-116a3 of the first loop 116a, the sub-layers 116b1-116b3 of the second loop 116b, and the sub-layers 116c1-116c3 of the third loop 116c of the light-collecting element 116 may have other configurations, such as a polygonal shape, in other exemplary image-sensing devices.

Figure 9:
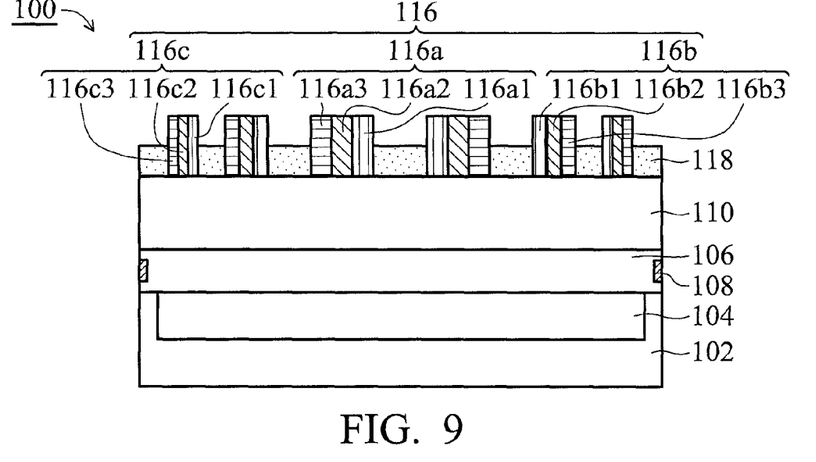
FIG. 9 is a schematic cross section showing an image-sensing device according to another embodiment of the invention.

FIG. 9 is a schematic cross section showing another exemplary image-sensing device 100. Components in the image-sensing device 100 shown in FIG. 9 are similar to those shown in FIG. 6, except that a buffer layer 118 is additionally disposed over the color pattern 110 and between the first loop 116a, the second loop 116b, and the third loop 116c of the light-collecting element 116.

As shown in FIG. 9, the buffer layer 118 may have a refractive index of about 1.2-1.7. In one embodiment, the buffer layer 118 may comprise materials such as magnesium fluoride ($MgF_2$), sodium fluoride (NaF), or strontium fluoride ($SrF_2$). The top surface of the buffer layer 118 is below top surfaces of the sub-layers 116a1-116a3 of the first loop 116a, top surfaces of the sub-layers 116b1-116b3 of the second loop 116b, and top surfaces of the sub-layers 116c1-116c3 of the third loop 116c of the light-collecting element 116. However, in other embodiments, the top surface of the buffer layer 118 can be level with or above (both not shown) the top surfaces of the sub-layers 116b1-116b3 of the second loop 116b, and the top surfaces of the sub-layers 116c1-116c3 of the third loop 116c of the light-collecting element 116.

Accordingly, due to the formation of the buffer layer 118 in the image-sensing device 100, reflection and scattering of incident light (not shown) that passes through the light-collecting element 110 and arrives at an interface between the light-collecting element 116 and the underlying color pattern 110 can be reduced or even eliminated, meaning that incident light will be focused toward a deeper portion of the photo-sensing element 104 compared with the portion that can be focused by a conventional microlens, and hence more light can be focused and arrive at the photo-sensing element 104. Therefore, the quantum efficiency of the photo-sensing element 104 can be improved, and the sensitivity of the image-sensing device 100 can also be improved. In addition, the image-sensing device 100 with the light-collecting element 116 shown in FIG. 9 can be also provided with a reduced vertical size compared with the vertical size that can be formed using a conventional microlens, so a more compact image-sensing device can be formed.

Figure 10:
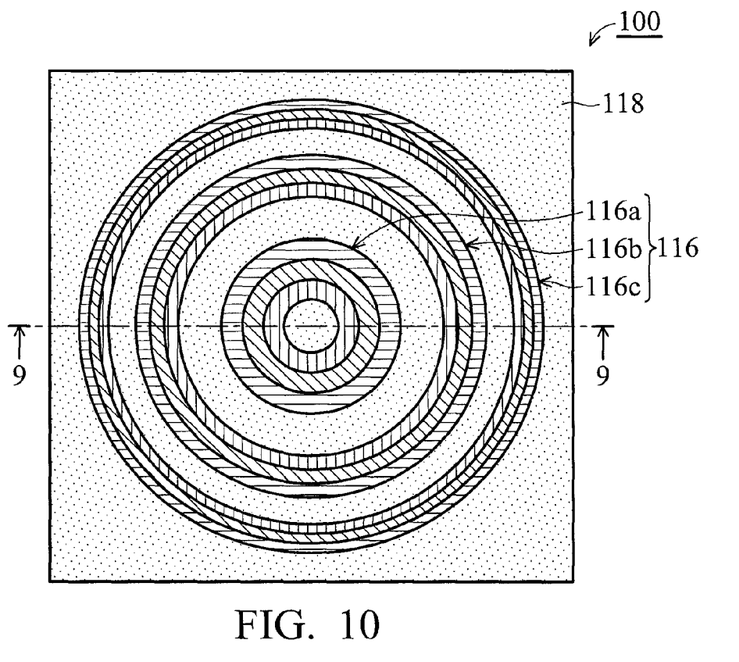
FIG. 10 is a schematic top view showing the image-sensing device in FIG. 9.

In addition, FIG. 10 is a schematic top view showing the image-sensing device 100 in FIG. 9, and the schematic cross section of the image-sensing device 100 in FIG. 9 is taken along line 9-9 in FIG. 10. For the purpose of simplicity, only the buffer layer 118 of the image-sensing device 100 and the first loop 116a, the second loop 116b, and the third loop 116c of the light-collecting element 116 are shown in FIG. 10 for discussion.

As shown in FIG. 10, the sub-layers 116a1-116a3 of the first loop 116a, the sub-layers 116b1-116b3 of the second loop 116b, and the sub-layers 116c1-116c3 of the third loop 116c of the light-collecting element 116 are provided as concentric loops separately formed over the color pattern 110. In addition, the sub-layers 116a1-116a3 of the first loop 116a, the sub-layers 116b1-116b3 of the second loop 116b, and the sub-layers 116c1-116c3 of the third loop 116c of the light-collecting element 116 may be circular loops from a top view, but are not limited thereto. In other embodiments, the sub-layers 116a1-116a3 of the first loop 116a, the sub-layers 116b1-116b3 of the second loop 116b, and the sub-layers 116c1-116c3 of the third loop 116c of the light-collecting element 116 may have other configurations, such as a polygonal shape, in other exemplary image-sensing devices.

Figure 11:
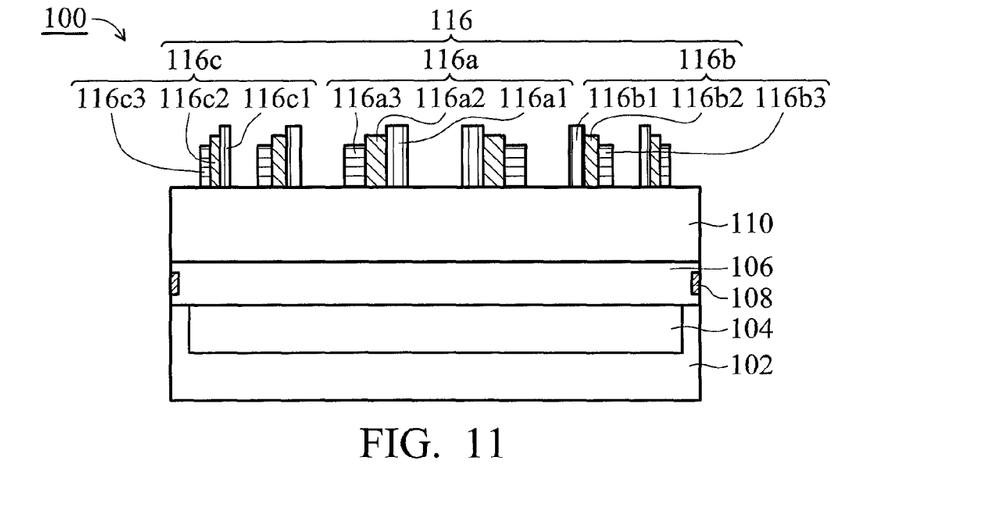
FIG. 11 is a schematic cross section showing an image-sensing device according to yet another embodiment of the invention.

FIG. 11 is a schematic cross section showing another exemplary image-sensing device 100. Components in the image-sensing device 100 shown in FIG. 11 are similar to those shown in FIG. 6, except that each of the first loop 116a, the second loop 116b, and the third loop 116c of the light-collecting element 116 now comprises a plurality of sub-layers of different refractive indices and different heights decreasing from an inner sub-layer to an outer sub-layer.

As shown in FIG. 11, the first loop 116a may have three sub-layers 116a1-116a3 of different refractive indices and different heights decreasing from an inner sub-layer (e.g. the sub-layer 116a1) to an outer sub-layer (e.g. the sub-layer 116a3). Similarly, the second loop 116b may have three sub-layers 116b1-116b3 of different refractive indices and different heights decreasing from an inner sub-layer (e.g. the sub-layer 116b1) to an outer sub-layer (e.g. the sub-layer 116b3), and the third loop 116c may have three sub-layers 116c1-116c3 of different refractive indices and different height decreasing from an inner sub-layer (e.g. the sub-layer 116c1) to an outer sub-layer (e.g. the sub-layer 116c3).

As shown in FIG. 11, the sub-layers 116a1-116a3 of the first loop 116a may have the same width, the sub-layers 116b1-116b3 of the second loop 116b may have the same width, and the sub-layers 116c1-116c3 of the third loop 116c may have the same width. The widths of the first loop 116a, the second loop 116b, and the third loop 116c, and pitches between the first, second, and third loops 116a, 116b, 116c can be properly designed to form the light-collecting element 116 as the Fresnel zone plate.

In an embodiment, the inner sub-layer (e.g. the sub-layers 116a1, 116b1, and 116c1) of the sub-layers of the first, second, and third loops 116a, 116b, and 116c may have a refractive index of about 2.0-2.5, the middle sub-layer (e.g. the sub-layers 116a2, 116b2, and 116c2) of the sub-layers of the first, second, and third loops 116a, 116b, and 116c may have a refractive index of about 1.7-2.0, and the outer sub-layer (e.g. the sub-layers 116a3, 116b3, and 116c3) of the sub-layers of the first, second, and third loops 116a, 116b, and 116c may have a refractive index of about 1.4-1.7.

In one embodiment, the inner sub-layer (e.g. the sub-layers 116a1, 116b1, and 116c1) of the inner sub-layer of the sub-layers of the first, second, and third loops 116a, 116b, and 116c may comprise materials such as hafnium oxide ($HfO_2$), tantalum oxide ($Ta_2O_3$), or titanium oxide ($TiO_2$), and the middle sub-layer (e.g. the sub-layers 116a2, 116b2, and 116c2) of the sub-layers of the first, second, and third loops 116a, 116b, and 116c may comprise materials such as magnesium oxide (MgO) or beryllia (BeO), and the outer sub-layer (e.g. the sub-layers 116a3, 116b3, and 116c3) of the sub-layers of the first, second, and third loops 116a, 116b, and 116c may comprise materials such as silicon oxide (SiO$_2$), barium fluoride (BaF$_2$), or calcium fluoride (CaF$_2$).

In one embodiment, the inner sub-layer (e.g. the sub-layers 116a1, 116b1, and 116c1) of the sub-layers of the first, second, and third loops 116a, 116b, and 116c may have a height of about 600-800 nm, and the middle sub-layer (e.g. the sub-layers 116a2, 116b2, and 116c2) of the sub-layers of the first, second, and third loops 116a, 116b, and 116c may have a height of about 400-600 nm, and the outer sub-layer (e.g. the sub-layers 116a3, 116b3, and 116c3) of the sub-layers of the first, second, and third loops 116a, 116b, and 116c may have a height of about 200-400 nm.

Accordingly, due to the formation of the light-collecting element 116 in the image-sensing device 100, incident light (not shown) that passes through the light-collecting element 116 will be focused into a deeper portion of the photo-sensing element 104 compared with the portion that can be focused using a conventional microlens, more incident light can be focused and arrive at the photo-sensing element 104. Therefore, the quantum efficiency of the photo-sensing element 104 can be improved, and the sensitivity of the image-sensing device 100 can also be improved. In addition, the image-sensing device 100 with the light-collecting element 116 shown in FIG. 11 can be also provided with a reduced vertical size compared with the vertical size that can be formed using a conventional microlens, so a more compact image-sensing device can be formed.

Figure 12:
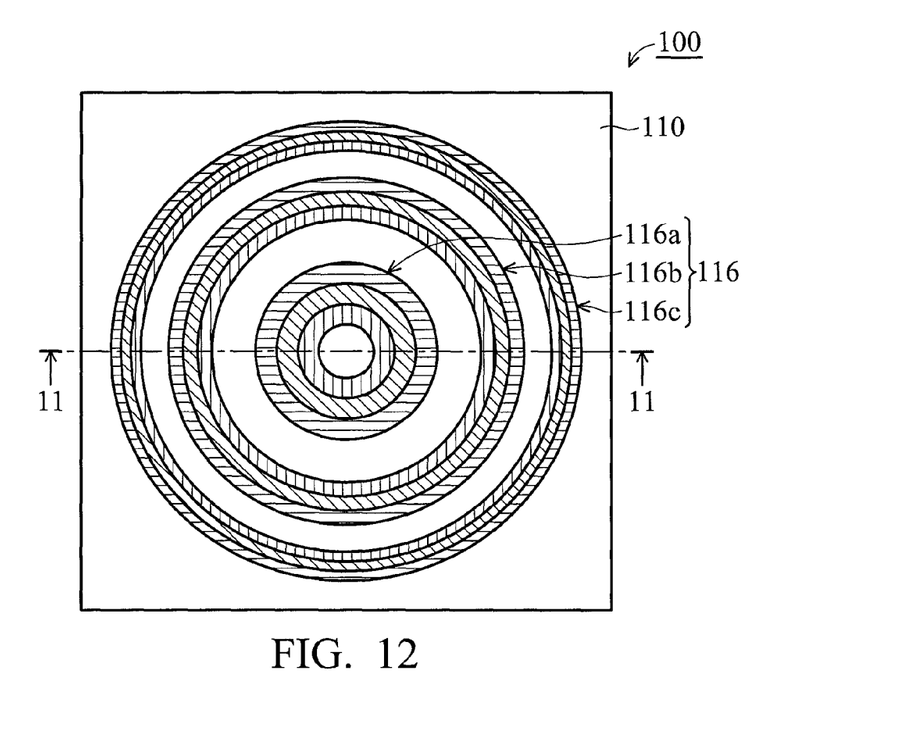
FIG. 12 is a schematic top view showing the image-sensing device in FIG. 11.

FIG. 12 is a schematic top view showing the image-sensing device 100 in FIG. 11, and the schematic cross section of the image-sensing device 100 in FIG. 9 is taken along line 11-11 in FIG. 12. For simplicity, only the photo-sensing element 104, the color pattern 110, and the light-collecting element 116 of the image-sensing device 100 are shown in FIG. 12 for discussion.

As shown in FIG. 12, the sub-layers 116a1-116a3 of the first loop 116a, the sub-layers 116b1-116b3 of the second loop 116b, and the sub-layers 116c1-116c3 of the third loop 116c of the light-collecting element 116 are provided as concentric loops separately formed over the color pattern 110. In addition, the sub-layers 116a1-116a3 of the first loop 116a, the sub-layers 116b1-116b3 of the second loop 116b, and the sub-layers 116c1-116c3 of the third loop 116c of the light-collecting element 116 may be circular loops from a top view, but are not limited thereto. In other embodiments, the sub-layers 116a1-116a3 of the first loop 116a, the sub-layers 116b1-116b3 of the second loop 116b, and the sub-layers 116c1-116c3 of the third loop 116c of the light-collecting element 116 may have other configurations, such as a polygonal shape, in other exemplary image-sensing devices.

Figure 13:
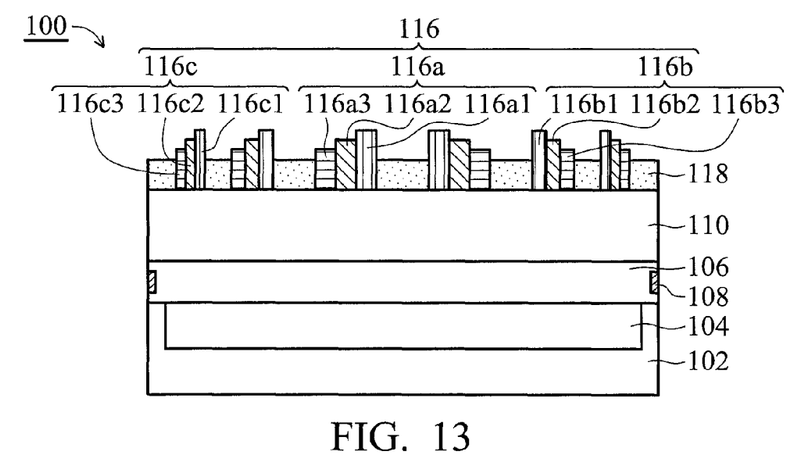
FIG. 13 is a schematic cross section showing an image-sensing device according to another embodiment of the invention.

FIG. 13 is a schematic cross section showing another exemplary image-sensing device 100. Components in the image-sensing device 100 shown in FIG. 13 are similar to those shown in FIG. 11, except that a buffer layer 118 is additionally disposed over the color pattern 110 and between the first loop 116a, the second loop 116b, and the third loop 116c of the light-collecting element 116.

As shown in FIG. 13, the buffer layer 118 may have a refractive index of about 1.2-1.7. In one embodiment, the buffer layer 118 may comprise materials such as magnesium fluoride (MgF$_2$), sodium fluoride (NaF), or strontium fluoride (SrF$_2$). The top surface of the buffer layer 118 is below top surfaces of the sub-layers 116a1-116a3 of the first loop 116a, top surfaces of the sub-layers 116b1-116b3 of the second loop 116b, and top surfaces of the sub-layers 116c1-116c3 of the third loop 116c of the light-collecting element 116. However, in other embodiments, the top surface of the buffer layer 118 can be level with or above (both not shown) the top surfaces of the sub-layers 116b1-116b3 of the second loop 116b, and the top surfaces of the sub-layers 116c1-116c3 of the third loop 116c of the light-collecting element 116.

Accordingly, due to the formation of the buffer layer 118 in the image-sensing device 100, reflection and scattering of incident light (not shown) that passes through the light-collecting element 110 and arrives at an interface between the light-collecting element 116 and the underlying color pattern 110 can be reduced or even eliminated, meaning that incident light will be focused toward a deeper portion of the photo-sensing element 104 compared with the portion that can be focused using a conventional microlens, and hence more light can be focused and arrive at the photo-sensing element 104. Therefore, the quantum efficiency of the photo-sensing element 104 can be improved, and the sensitivity of the image-sensing device 100 can also be improved.

Figure 14:
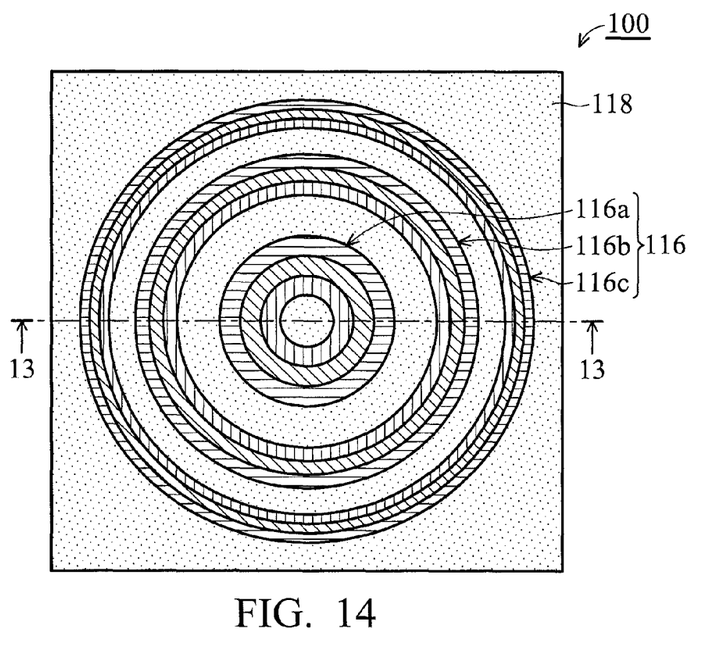
FIG. 14 is a schematic top view showing the image-sensing device in FIG. 13.

In addition, FIG. 14 is a schematic top view showing the image-sensing device 100 in FIG. 13, and the schematic cross section of the image-sensing device 100 in FIG. 13 is taken along line 13-13 in FIG. 14. For the purpose of simplicity, only the buffer layer 118 of the image-sensing device 100 and the first loop 116a, the second loop 116b, and the third loop 116c of the light-collecting element 116 are shown in FIG. 14 for discussion.

As shown in FIG. 14, the sub-layers 116a1-116a3 of the first loop 116a, the sub-layers 116b1-116b3 of the second loop 116b, and the sub-layers 116c1-116c3 of the third loop 116c of the light-collecting element 116 are provided as concentric loops separately formed over the color pattern 110. In addition, the sub-layers 116a1-116a3 of the first loop 116a, the sub-layers 116b1-116b3 of the second loop 116b, and the sub-layers 116c1-116c3 of the third loop 116c of the light-collecting element 116 may be circular loops from a top view, but are not limited thereto. In other embodiments, the sub-layers 116a1-116a3 of the first loop 116a, the sub-layers 116b1-116b3 of the second loop 116b, and the sub-layers 116c1-116c3 of the third loop 116c of the light-collecting element 116 may have other configurations, such as a polygonal shape, in other exemplary image-sensing devices.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image-sensing device, comprising:
   a semiconductor substrate comprising a photo-sensing element;
   a passive layer disposed over the semiconductor substrate; and
   a light-collecting element disposed over the passive layer, comprising:
      a first loop having a first width;
      a second loop surrounding the first loop, having a second width that is less than the first width;
      a third loop surrounding the first and second loops, having a third width that is less than the second width, wherein the light-collecting element aligns with the photo-sensing element, and the first, second, and third loops are made of different materials having different refractive indices.

2. The image-sensing device claimed in claim 1, wherein the first, second and third loops are concentric loops separately formed over the passive layer, and the first, second and third loops form a Fresnel zone plate.

3. The image-sensing device claimed in claim 1, wherein the first, second and third loops are circular loops from a top view.

4. The image-sensing device claimed in claim 1, further comprising a color pattern disposed between the passive layer and the light-collecting element, wherein the color pattern aligns with the photo-sensing element and the light-collecting element, having a color selected from the group consisting of red (R), green (G), blue (B) and white (W).

5. The image-sensing device claimed in claim 1, wherein the first loop has a refractive index of about 1.4-1.7, the second loop has a refractive index of about 1.7-2.0, and the third loop has a refractive index of about 2.0-2.5.

6. The image-sensing device claimed in claim 5, wherein the first loop comprises silicon oxide, barium fluoride, or calcium fluoride, and the second loop comprises magnesium oxide or beryllia, and the third loop comprises hafnium oxide, tantalum oxide, or titanium oxide.

7. The image-sensing device claimed in claim 5, further comprising a buffer layer disposed over the passive layer and between the first, second, and third loops.

8. The image-sensing device claimed in claim 7, wherein the buffer layer has a refractive index of about 1.2-1.7.

9. The image-sensing device claimed in claim 8, wherein the buffer layer comprises magnesium fluoride, sodium fluoride, or strontium fluoride.

10. The image-sensing device claimed in claim 7, wherein a top surface of the buffer layer is below, level with or over a top surface of the first, second, and third loops.

11. An image-sensing device, comprising:
a semiconductor substrate comprising a photo-sensing element;
a passive layer disposed over the semiconductor substrate; and
a light-collecting element disposed over the passive layer, comprising:
a first loop having a first width;
a second loop surrounding the first loop, having a second width that is less than the first width;
a third loop surrounding the first and second loops, having a third width that is less than the second width, wherein the light-collecting element aligns with the photo-sensing element, and the first, second, and third loops comprise different refractive indices;
wherein each of the first, second, and third loops comprises a plurality of sub-layers having different refractive indices decreasing from an inner sub-layer to an outer sub-layer.

12. The image-sensing device claimed in claim 11, wherein the sub-layers of the first loop have the same width, the sub-layers of the second loop have the same width, and the sub-layers of the third loop have the same width.

13. The image-sensing device claimed in claim 11, wherein the inner sub-layer of the sub-layers of the first, second, and third loops has a refractive index of about 2.0-2.5, and the outer sub-layer of the sub-layers of the first, second, and third loops has a refractive index of about 1.4-1.7.

14. The image-sensing device claimed in claim 11, further comprising a buffer layer disposed over the passive layer and between the first, second, and third loops.

15. The image-sensing device claimed in claim 14, wherein the buffer layer has a refractive index of about 1.2-1.7.

16. The image-sensing device claimed in claim 15, wherein the buffer layer comprises magnesium fluoride, sodium fluoride, or strontium fluoride.

17. The image-sensing device claimed in claim 14, wherein a top surface of the buffer layer is below, level with or over a top surface of sub-layers of the first, second, and third loops.

18. The image-sensing device claimed in claim 12, wherein the sub-layers of the first loop have different heights decreasing from an inner sub-layer to an outer sub-layer, the sub-layers of the second loop have different heights decreasing from an inner sub-layer to an outer sub-layer, and the sub-layers of the third loop have different heights decreasing from an inner sub-layer to an outer sub-layer.

19. The image-sensing device claimed in claim 18, wherein the inner sub-layer of the first, second, and third loops has a height of about 600-800 nm, and the outer sub-layer of the first, second, and third loops has a height of about 200-400 nm.

* * * * *